US007325649B1

(12) United States Patent
Budge

(10) Patent No.: US 7,325,649 B1
(45) Date of Patent: Feb. 5, 2008

(54) LOUDSPEAKER WITH PROGRESSIVELY DAMPED ACOUSTICAL CHAMBER

(75) Inventor: Tierry R. Budge, Orem, UT (US)

(73) Assignee: Farnsworth & Budge, LLC, Draper, UT (US)

( * ) Notice: Subject to any disclaimer, the term of this patent is extended or adjusted under 35 U.S.C. 154(b) by 0 days.

(21) Appl. No.: 09/405,429

(22) Filed: Sep. 23, 1999

(51) Int. Cl.
*H05K 5/00* (2006.01)

(52) U.S. Cl. ....................... 181/151; 181/146; 181/153; 181/156

(58) Field of Classification Search ................. 181/146, 181/148, 151, 153, 154, 156, 166, 199
See application file for complete search history.

(56) References Cited

U.S. PATENT DOCUMENTS 2,993,091 A 7/1961 Guss
3,918,551 A 11/1975 Rizo-Patron
4,127,751 A * 11/1978 Kinoshita .................. 181/146
4,439,644 A * 3/1984 Bruney, III .................. 181/151
5,194,701 A * 3/1993 Yamada-Scriba ........... 181/199
5,844,176 A 12/1998 Clark

* cited by examiner

*Primary Examiner*—Khanh Dang
(74) *Attorney, Agent, or Firm*—Kirton & McConkie; Michael F. Krieger

(57) ABSTRACT

The present invention relates to a novel acoustical chamber for enclosed loudspeakers which help direct and control sound waves within the enclosure thereby enhancing sound output. The present invention utilizes a method of progressive damping which utilizes multiple layers of damping material or layers of material with variable density or damping characteristics within an enclosed chamber. The damping material is arranged such that the density of the material in the chamber decreases as the distance from the driver increases. The damping materials may also be configured such that the density of the material in the chamber increases as the transverse distance from the center of the chamber increases, that is, the density of the material along the outer surfaces of the chamber is denser than material which is transversely inward from the outer surfaces.

19 Claims, 2 Drawing Sheets

LOUDSPEAKER WITH PROGRESSIVELY DAMPED ACOUSTICAL CHAMBER

THE FIELD OF THE INVENTION

The present invention relates to the field of high-quality audio loudspeakers and more particularly to enclosed loudspeakers with ported or sealed acoustical chambers for manipulation of driver backwaves. The speakers of the present invention comprise one or more acoustical chambers with multiple layers of damping materials which become less dense as the distance from the driver increases. Additionally, the acoustical chambers of preferred embodiments of the present invention decrease in cross sectional area, to a minimum cross-sectional area equal to that of the driver's surface area, and narrow to this "minimum" at the greatest distance from a driver.

BACKGROUND

Loudspeakers are essentially transducers which convert electrical energy into physical, acoustical energy. The design of typical basic loudspeakers has not changed for decades. Generally, a loudspeaker driver consists of a frame or housing, a cone or other diaphragm attached to a voice coil, a surround and spider suspension and a permanent magnet. Sound is created by moving the diaphragm to create sound waves in the air around the diaphragm. This is accomplished through electromagnetic attraction and repulsion of the voice coil. The outer periphery of the diaphragm is connected to the housing or frame by a flexible surround which allows the diaphragm to move freely and helps somewhat to keep the diaphragm and voice coil in proper alignment. The voice coil is typically a coil of wire which forms an inductor. As electrical current passes through the coil it produces a magnetic field. The voice coil is placed in close proximity to a permanent magnet which provides a permanent magnetic field which react with the variable magnetic field of the coil thereby causing the coil to be repelled or attracted according to the field of the coil and the polarity and magnitude of the coil current. The spider and surround keep the coil in precise alignment with the permanent magnet so that minute changes in current in the coil can accurately produce diaphragm movement and sound.

The physical characteristics of drivers can make them more suitable for reproducing sounds in certain frequency ranges. High frequency sound requires a driver that can react quickly, but which does not need a diaphragm that must displace a substantial distance. Low frequency sound requires a driver that can displace longer distances, but which does not need to react as quickly. Consequently, larger drivers, called woofers, are typically used to reproduce low frequency sound while very small, rigid drivers, called tweeters, are used for high frequency sound. A high-quality loudspeaker will generally have multiple drivers for reproducing sound in a variety of frequency ranges. Many loudspeakers will have at least a woofer, midrange and a tweeter to reproduce the entire audible sound spectrum, however, as the following disclosure will reveal, this can be achieved in other ways.

One problem inherent in typical driver design is the "backwave" created when the diaphragm rebounds from an extended position. This creates a sound wave which emanates from the back of the diaphragm which, if not controlled, may interfere with and even cancel the primary sound wave created by the diaphragm.

One method of dealing with backwave interference is to mount the driver in a sealed enclosure that will absorb the majority of the backwave preventing it from reaching the listener. This is commonly known as an "acoustic suspension" speaker. Another popular method of dealing with backwave emissions is to allow part of the wave to reach the listening area through a vent or port. This is known as a "bass reflex" design. Yet another method involves the use of a passive radiator or "drone driver" which vibrates with the backwave thereby absorbing energy and helping eliminate the backwave. All of these methods help somewhat to eliminate backwave interference, however they do so at the cost of lost energy and performance.

Backwave interference can also be dealt with using a bipolar speaker configuration. The typical bipolar configuration utilizes two identical drivers which are mounted in the front and back of a speaker enclosure. These two drivers are driven in-phase so that identical waves are emitted from the front and back of the enclosure. This eliminates the backwave cancellation problem because the waves are in-phase, but the drivers can suffer from a decreased response and lost energy due to the need to overcome increased pressure in the enclosure.

Another problem inherent with woofers which must move fair distances in order to reproduce low frequencies and large outputs is that of inertia. Once a driver diaphragm is displaced it must return to a neutral position before subsequent displacement. Inertia makes stopping a diaphragm at a neutral position difficult after a substantial displacement. Ideally, a woofer would need to increase its mechanical impedance as the distance from its neutral, or static, position increases. However, even if a driver is designed to near mechanical perfection, with the restorative force being equal to that of the initial current, stopping the driver at the "neutral" position remains a challenge.

An additional problem with current speaker technology is caused by misalignment of the voice coil with the permanent magnet due to distortion of the diaphragm or cone. Driver surrounds and spiders must be flexible to provide the necessary response to electrical input, but this makes the driver diaphragm extremely susceptible to unequal air pressure across its surface area. As a diaphragm encounters unequal air pressure due to enclosure discontinuities or air flow patterns, the diaphragm distorts causing the attached voice coil to rotate off its central axis. This causes the precisely balanced magnetic fields of the permanent magnet and the voice coil to misalign thereby causing an inductive variance and increased current draw from the amplifier. This results in decreased power handling, poorer response and inaccurate reproduction of sound.

What is needed is an apparatus and method for controlling driver backwaves and the air pressure and flow at the rear of the driver.

Backwave and air pressure problems are complicated by the fact that while a build-up of pressure is deleterious to linear operation, a certain amount of back pressure can help control driver inertial problems. The helpful portion of the back pressure relates directly to the mechanical movement of the driver and is purely an attempt to control over-excursion. Hence, a decrease in cross sectional area allows for a measure of pressure build-up. The minimum cross sectional area being that of the radiating area of the driver in question helps to ensure that modulation through pressure build-up is kept to a minimum.

SUMMARY AND OBJECTS OF THE INVENTION

Some embodiments of the present invention comprise loudspeakers with drivers mounted in an enclosure having a chamber through which sound waves, which do not directly emanate to the exterior of the enclosure, are directed to the exterior. These interior sound waves may be back waves which emanate from the back of a driver which is directed toward the exterior of the enclosure or they may be primary front waves emanating from drivers which are directed to the interior of the enclosure such as in some multipolar configurations.

Backwaves returning to the cone can cause reinforcements of identical waves, or cancellations with adjacent frequencies. Since sound travels more slowly through denser materials (in acoustics, many "damping" materials have fractional multipliers defining exactly how much the speed of sound is slowed through said material), a graduated system is established wherein the densest combination of materials is closest to the driver. The lowest density is at the greatest distance. Thus, the speed of sound increases with the distance to the driver's radiating surface. Once the sound has traveled to the furthest point of the enclosure, the denser mediums closer to the driver now represent a source of great impedance.

The interior chamber of some embodiments of the present invention may have almost any geometric configuration that will accept damping material. Preferred embodiments have shapes with progressively smaller cross-sections, however cross-sections smaller than that of the driver are not preferred.

The damping structure of preferred embodiments of the present invention decreases in density as its distance from a driver increases. This decrease in density creates a decrease in resistance experienced by a sound wave which helps direct the sound wave to a destination and help prevent sound waves from following an opposite path. The effect is much like a pressurized fluid following a path of least resistance. The damping material is placed in a manner that will promote movement of sound waves from the driver through the chamber and toward the exterior of the enclosure.

This sound wave direction is achieved by arranging the damping material in a configuration of decreasing density as the distance along the path from driver to exterior of enclosure increases. Preferred embodiments also have damping material configured to increase in density from the center of the sound path to the perimeter of the chamber.

Damping material density may be varied by using materials of non-uniform density however, these materials can be difficult to produce and control. Material density may also be controlled by using distinct layers of uniform density material which can have a constant thickness throughout a specific section of the chamber or which may be tapered thereby decreasing the overall density of the chamber without abrupt changes. Material density may also be varied with layers of constant thickness when the thickness is changed in successive sections of the chamber.

Accordingly, it is an object of some embodiments of the present invention to provide a loudspeaker with improved sound reproduction.

It is another object of some embodiments of the present invention to provide a loudspeaker with reduced cancellation.

It is yet another object of some embodiments of the present invention to provide a loudspeaker with reduced interference.

BRIEF DESCRIPTION OF THE DRAWINGS

In order that the manner in which the above-recited and other advantages and objects of the invention are obtained, a more particular description of the invention briefly described above will be rendered by reference to a specific embodiment thereof which is illustrated in the appended drawings. Understanding that these drawings depict only a typical embodiment of the invention and are not therefore to be considered to be limiting of its scope, the invention will be described and explained with additional specificity and detail through the use of the accompanying drawings in which.

DETAILED DESCRIPTION OF THE PREFERRED EMBODIMENTS

In the following description, preferred embodiments of the present invention are described by referring to functional diagrams, schematic diagrams, functional flow charts, program flow charts and other graphic depictions which help to illustrate either the structure or processing of preferred embodiments used to implement the apparatus, system and method of the present invention. Using the diagrams and other depictions in this manner to present the invention should not be construed as limiting of its scope.

Figure 1:
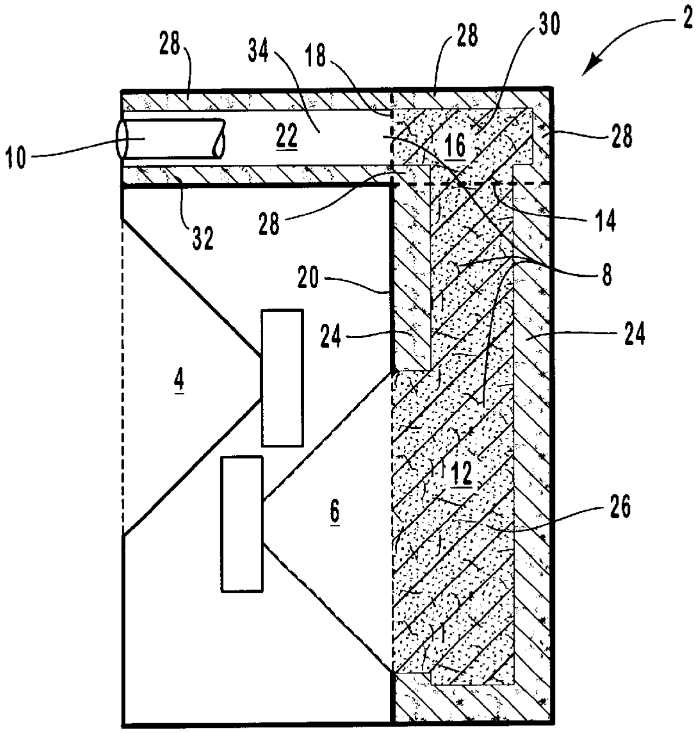
FIG. 1 is a cross-sectional view of an apparatus of a first embodiment of the present invention showing sectionalized and layered damping material.

In reference to FIG. 1, a first embodiment of the present invention comprises a speaker enclosure 2 with an exterior driver 4 and an interior driver 6 mounted therein. An acoustical chamber 8 is formed in enclosure 2. Chamber 8 extends from driver 6 to the exterior of the enclosure and may terminate at the exterior in a port 10 or some other type of opening. Chamber 8, as shown in this embodiment, may be regarded as having three sections. A first section 12 begins near driver 6 and extends vertically to the top of vertical enclosure partition 20 terminating at first dashed line 14. Second section 16 extends from dashed line 14 around the comer to second dashed line 18 and third section 22 extends from line 18 to the exterior of enclosure 2. This first embodiment of the present invention incorporates damping material layers of roughly constant thickness in each section. The thickness of the layers varies from section to section in order to create areas of diminishing density or damping as the distance from driver 6 increases.

In first section 12 an outer layer 24 of low to medium density foam surrounds the periphery of section 12. Outer layer 24 may vary widely in thickness, however a range of thickness from 2 inches to 3 inches performs well for drivers in the sub-woofer to mid-range categories. The remainder of first section 12 is filled with an inner layer 26 of low density polyester batting having a density or damping lower than that of outer layer 24.

Second section 16 has an outer layer 28 of low to medium density foam around its periphery. However, in second section 16, this outer layer has a thickness of about 1". The remainder of second section 16 is filled with an inner layer 30 of low density polyester batting. The decreased thickness of outer layer 28 in relation to outer layer 24 provides a decreased overall density or damping in second section 16 as compared to first section 12.

Third section 22 also has an outer layer 32 of low to medium density foam. Outer layer 32 may have a thickness substantially equal to or less than that of outer layer 28 because the decreased density of third section 22 is provided by an inner layer 34 substantially without damping material. Some damping material may be used in inner layer 34, particularly when outer layer 32 has a thickness less than that of outer layer 28, provided the overall density or damping of third section 22 is less than that of second section 16.

Figure 2:
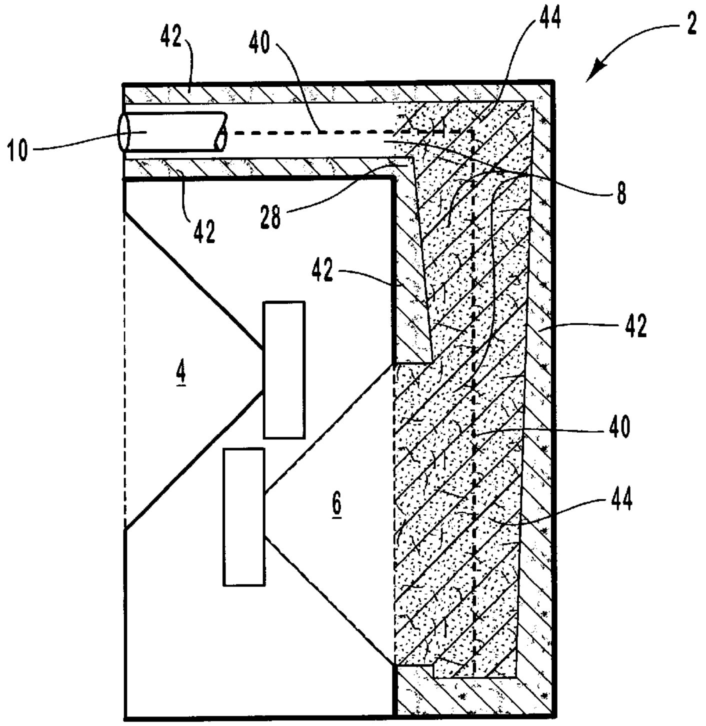
FIG. 2 is a cross-sectional view of an apparatus of a second embodiment of the present invention showing tapered damping material.

A second embodiment of the present invention may be understood in reference to FIG. 2 wherein an enclosure 2, exterior driver 4, interior driver 6, acoustical chamber 8 and port or exit 10 have a configuration similar to that of FIG. 1. Chamber 8 may have a longitudinal axis 40 which roughly follows the centroid of transverse cross-sections through chamber 8. Axis 40 can be said to follow the approximate center of the path between driver 6 and exit 10 although substantial deviations from center may occur without affecting the purpose of the present invention. The damping material of this second embodiment is arranged to provide decreased density or damping as the distance, along axis 40, from driver 6 increases while also generally increasing in density as the transverse distance from axis 40 increases. This is achieved by using a tapered outer layer 42 of low to medium density foam which decreases in thickness from a position proximate to driver 6 to a position proximate to point of exit 10. The density transition of chamber 8 is further enhanced with tapered inner layer 44 typically composed of low-density polyester batting, and which completely fills the remainder of chamber 8 near driver 6, but which does not fully extend to exit point 10 without substantial decrease in thickness, density or damping characteristics. Inner layer 44 may decrease in thickness or may simply stop short of exit point 10 so as to provide a decreased density at that end of chamber 8 near exit 10.

Figure 3:
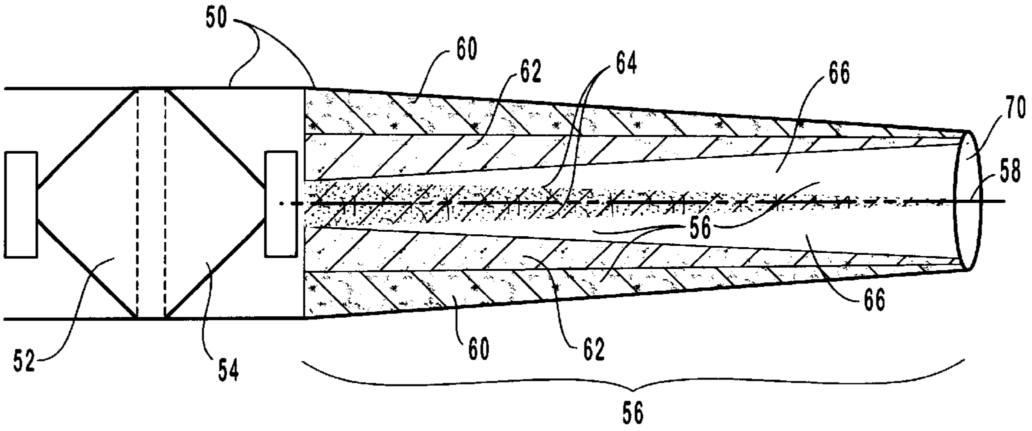
FIG. 3 is a cross-sectional view of an apparatus of a third embodiment of the present invention showing tapered damping material.

Another, third, embodiment of the present invention, as shown in FIG. 3, comprises an enclosure 50 containing external driver 52 and internal driver 54 and further comprising an acoustical chamber 56 with a longitudinal centroidal axis 58. Chamber 56 has a circular cross-section in this particular shown embodiment, however, the cross-sectional shape of chamber 56 is not critical to the advantages of the present invention and nearly any cross-sectional shape will prove adequate. In this particular embodiment, chamber 56 and axis 58 are linear, however, the path of chamber 56 and, consequently, that of axis 58 may be circuitous, making multiple bends if necessary, to complete its course from driver to exterior of enclosure.

Chamber 56 is lined with a first outer layer 60 of damping material composed of foam or some other moderate density damping material. Outer layer 60 has a tapered thickness which becomes thinner as its distance from driver 54 increases. Outer layer 60 preferably begins proximate to driver 54 with a maximum thickness and extends toward exit 70 tapering to a minimal thickness or terminating at any point between driver 54 and exit 70. When drivers 54 and 52 are typical subwoofer to midrange drivers a maximum thickness of about 2" to about 3" is preferred.

A second intermediate damping layer 62 having a density less than that of outer layer 60 resides in chamber 54 inside outer layer 60. Second layer 62 may be composed of low to medium density foam, low to medium density polyester batting or some other damping material. Second layer 62 also has a thickness which tapers to become thinner as the distance from driver 54 increases. Second layer 62 may taper to a minimal thickness or terminate at any point between driver 54 and exit 70 so long as the overall density or damping of the chamber decreases with distance from driver 54.

A third inner or axial layer 64 of damping material may be placed inside second layer 62. Third layer 64 is composed of a damping material with a density or damping less than that of the material of which second layer 62 is composed. Third layer 64 may fill the entire space remaining within chamber 56 or may fill a portion of that space with an axial cone, as shown, with some other shape which provides a decreasing density as the distance from driver 54 increases.

When third layer 64 does not fill the remaining space in chamber 56 a fourth layer 66 may be formed in the remaining space in chamber 56. Fourth layer 66 will have a density less than that of the other layers when it is the innermost layer as shown in this embodiment. Fourth layer 66 may be filled with a low-density damping material or may simply be filled with ambient air.

Figure 4:
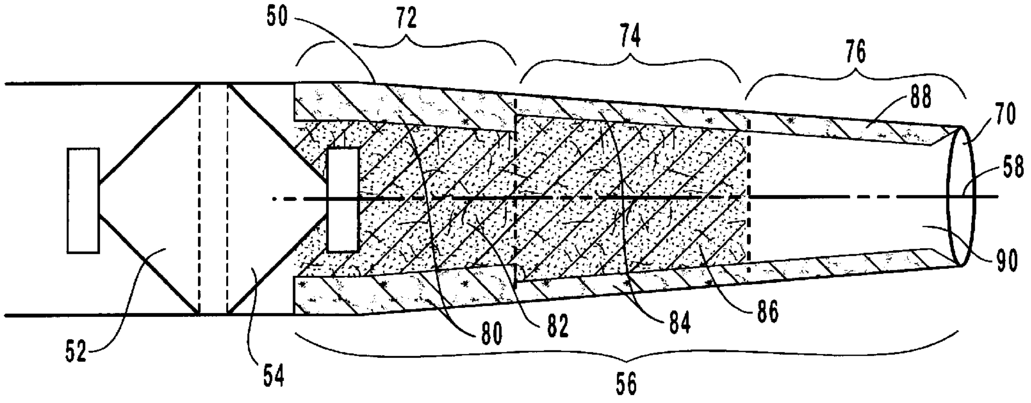
FIG. 4 is a cross-sectional view of an apparatus of a fourth embodiment of the present invention showing sectionalized and layered damping material.

A fourth embodiment of the present invention is shown in FIG. 4 and has an enclosure 50, exterior driver 52, interior driver 54, chamber 56, exit 70, and axis 58 similar to that of the third embodiment, however this fourth embodiment comprises a first section 72, second section 74 and third section 76 which are portions of chamber 56. Each successive section progressing from driver 54 to exit 70 decreases in overall density or damping. First section 72 contains a first outer layer 80 of damping material around its perimeter and a first inner layer 82 of damping material inside first outer layer 80 with first inner layer 82 having a density or damping effect less than that of first outer layer 80. In this embodiment, first outer layer 80 has a uniform thickness throughout first section 72 while first inner layer 82 fills the remainder of first section 72.

Second section 74 comprises a second outer layer 84 having a thickness which is less than the thickness of first outer layer 80. Inside second outer layer 84 is second inner layer 86 which is typically composed of the same material as first inner layer 82. The overall density or damping effect of second section 74 is less than that of first section 72 due to the decrease in thickness of second outer layer 84 relative to first outer layer 80.

Third section 76 comprises a third outer layer 88 which has a thickness equal to or less than that of second outer layer 84. Third inner layer 90 may be filled with a damping material with a density lower than that of second inner layer 86, however, preferred embodiments are void of structural damping material containing only ambient air. The reduction in density of the material in third inner layer 90 or the lack of substantial material therein serves to reduce the overall density or damping effect of third section 76 below that of second section 74. This fourth embodiment differs from the third embodiment in that the outer layers of damping material have uniform thickness throughout each section of the chamber. Also different quantities of layers are used. Different variations of these concepts which achieve the same progressive reduction in density or damping effect along the chamber are to be considered within the scope of the present invention.

Figure 5:
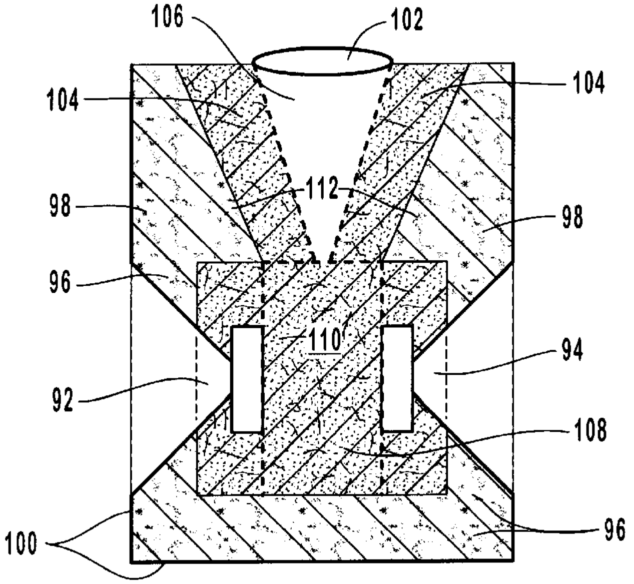
FIG. 5 is a cross-sectional view of an apparatus of a fifth embodiment of the present invention showing an enclosure with damping material in a pattern of progressively lower density as distance from the drivers increases.

A fifth, alternative embodiment of the present invention, as shown in FIG. 5, comprises a speaker enclosure 100 with a first external driver 92 and a second external driver 94 mounted therein. Speaker enclosure 100 also comprises an exit 102 from which sound within enclosure 100 may emanate. When multiple drivers are positioned in close proximity ajunction chamber 110 may be constructed to direct the combined sound from the drivers to a single exit point 102. This may be achieved by lining the sides and floor of junction chamber 110 with a first outer layer of damping material 96. This first outer layer 96 may have voids therein to accommodate drivers 92 & 94. A first inner layer 108 composed of low density damping material fills the remainder of junction chamber 110.

This fifth embodiment further comprises a progressive damping chamber 112 which has a progressively decreasing density or damping effect as the distance from junction chamber 110 increases. Progressive chamber 112 comprises second outer layer 98 composed of a first damping material which is tapered or otherwise shaped to have a decreased thickness as its distance from junction chamber 110 increases. Progressive chamber 112 further comprises a second inner layer 104 of damping material with a density less than that of second outer layer 98 which may fill the remainder of progressive chamber 112 or may be shaped to have a void 106 therein such that the overall density or damping effect of progressive chamber 112 decreases toward exit 102.

The present invention may be embodied in other specific forms without departing from its spirit or essential characteristics. The described embodiments are to be considered in all respects only as illustrated and not restrictive. The scope of the invention is, therefore, indicated by the appended claims rather than by the foregoing description. All changes which come within the meaning and range of equivalency of the claims are to be embraced within their scope.

What is claimed is:

1. A loudspeaker apparatus comprising:

one or more drivers;

an acoustical chamber;

damping material placed within said chamber, said material being configured such that the overall density of the material decreases with increased distance from said driver.

2. The loudspeaker apparatus of claim 1 wherein the cross-sectional area of said chamber decreases with increased distance from said driver.

3. The loudspeaker apparatus of claim 1 wherein the cross-sectional area of said chamber is always greater than the cross-sectional area of said driver.

4. The loudspeaker apparatus of claim 1 wherein said damping material has a plurality of longitudinally oriented layers with each layer having a different density.

5. The loudspeaker apparatus of claim 4 wherein said layers are further divided into transverse sections.

6. The loudspeaker apparatus of claim 5 wherein each of said transverse sections has a successively lower average density with increasing distance from said driver.

7. The loudspeaker apparatus of claim 4 wherein said layers are oriented successively inwardly around the periphery of said chamber such that a first layer borders a perimeter of said chamber and a second layer falls directly within said first layer and successive layers continue inwardly.

8. The loudspeaker apparatus of claim 7 wherein said layers become successively less dense toward the cross-sectional center of said chamber.

9. A loudspeaker apparatus comprising:

at least one driver;

a loudspeaker enclosure having an interior and an exterior;

an acoustical chamber leading from said at least one driver to the exterior of said enclosure;

a layer of relatively denser damping material placed around the periphery of said chamber;

a layer of relatively lighter damping material placed within said denser damping material.

10. The loudspeaker apparatus of claim 9 wherein said relatively denser damping material is a foam material.

11. The loudspeaker apparatus of claim 9 wherein said relatively lighter damping material is a polyester batting material.

12. The loudspeaker apparatus of claim 9 wherein said layer of relatively denser damping material decreases in thickness with an increase in distance from said driver.

13. The loudspeaker apparatus of claim 9 wherein said layer of relatively lighter damping material increases in thickness with an increase in distance from said driver.

14. A loudspeaker apparatus comprising:

at least one driver;

a loudspeaker enclosure having an interior and an exterior;

an acoustical chamber leading from said at least one driver to the exterior of said enclosure, said chamber having a longitudinal center axis leading from a point proximate to said driver to a center of a port leading to said exterior of said enclosure;

at least one damping material which becomes denser as its distance from said axis increases.

15. The loudspeaker apparatus of claim 14 wherein said at least one damping material comprises a plurality of density distinct layers which get progressively denser as their distance from said axis increases.

16. The loudspeaker apparatus of claim 14 wherein said at least one damping material comprises a plurality of density distinct layers which get progressively less dense as their distance from said driver increases along said axis.

17. A loudspeaker apparatus comprising:

at least one driver;

a loudspeaker enclosure having an interior and an exterior;

an acoustical chamber leading from said at least one driver to the exterior of said enclosure, said chamber being divided into a plurality of sections each progressive section being more distant from said driver;

an axis which passes from a point proximate to said driver to a point on said exterior, and a plurality of density distinct damping material layers in each of said sections, said layers becoming denser as their distance from said axis increases.

18. The loudspeaker apparatus of claim 17 wherein the cross-sectional area of said sections decreases as the distance from said driver increases and wherein the cross-sectional area of all sections is at least as large as a cross-sectional area of said driver.

19. A loudspeaker apparatus comprising:

at least one driver;

a loudspeaker enclosure having an interior and an exterior;

an acoustical chamber leading from said at least one driver to the exterior of said enclosure, said chamber being divided into a plurality of sections each progressive section being more distant from said driver;

an axis which passes from a point proximate to said driver to a point on said exterior;

a plurality of density distinct damping material layers in each of said sections, said layers becoming denser as their distance from said axis increases; and wherein said plurality of sections comprises three sections and said plurality of density distinct material layers comprises two layers and wherein a thickness of an outer layer in a first section most proximate to said driver ranges between about 2" and about 3" and an inner layer of said layers fills the remaining volume of said section and wherein an outer layer in a second intermediately positioned section has about the same density as said outer layer in said first section but with a thickness of about 1" and an inner layer in said second section has about the same density as said inner layer in said first section and fills the remainder of said second section and wherein an outer layer in a third most distal layer from said driver has a density about the same as said outer layer in said first section and a thickness of about 1" and said inner layer in said third section is substantially void of damping material.

* * * * *